US008928062B2

(12) United States Patent
Yasuda (10) Patent No.: US 8,928,062 B2
(45) Date of Patent: Jan. 6, 2015

(54) NONVOLATILE SEMICONDUCTOR MEMORY DEVICE AND MANUFACTURING METHOD THEREOF

(75) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 829 days.

(21) Appl. No.: 12/408,796

(22) Filed: Mar. 23, 2009

(65) Prior Publication Data

US 2010/0117136 A1 May 13, 2010

(30) Foreign Application Priority Data

Nov. 13, 2008 (JP) ................................ 2008-291217

(51) Int. Cl.
| | |
|---|---|
| *H01L 29/792* | (2006.01) |
| *H01L 29/423* | (2006.01) |
| *H01L 27/12* | (2006.01) |
| *H01L 29/51* | (2006.01) |
| *H01L 21/84* | (2006.01) |
| *H01L 29/06* | (2006.01) |
| *H01L 21/28* | (2006.01) |
| *H01L 21/762* | (2006.01) |

(52) U.S. Cl.
CPC .......... *H01L 29/792* (2013.01); *H01L 29/4234* (2013.01); *H01L 27/1203* (2013.01); *H01L 29/513* (2013.01); *H01L 21/76243* (2013.01); *H01L 21/84* (2013.01); *H01L 29/0653* (2013.01); *H01L 21/28282* (2013.01)
USPC ........... 257/324; 257/297; 257/314; 257/315; 257/E21.645; 257/E21.661; 257/E21.69; 257/E27.103; 257/E27.084; 257/E27.104; 257/E29.309; 365/185.08; 365/185.17; 365/185.18; 365/185.27; 365/185.29; 438/195; 438/197; 438/201; 438/211; 438/218; 438/257; 438/264; 438/279; 438/283

(58) Field of Classification Search
CPC ................... H01L 21/28273; H01L 29/66825; H01L 27/105; H01L 27/11568; H01L 29/42324; H01L 27/11524; H01L 27/10802; H01L 29/7841; H01L 29/792; H01L 29/788
USPC .................. 257/297, 314, 315, 324, E21.645, 257/E21.646, E21.661, E21.69, E21.679, 257/E21.703, E27.084, E27.103, E27.104, 257/E29.309; 365/185.08, 185.17, 185.18, 365/185.22, 185.27, 185.29; 438/195, 197, 438/201, 211, 218, 257, 264, 279, 283
See application file for complete search history.

(56) References Cited

U.S. PATENT DOCUMENTS

| | | | |
|---|---|---|---|
| 6,469,350 B1 * | 10/2002 | Clark et al. ................... | 257/349 |
| 2008/0099811 A1 * | 5/2008 | Tak et al. ...................... | 257/297 |
| 2009/0184362 A1 * | 7/2009 | Lee ............................... | 257/324 |

FOREIGN PATENT DOCUMENTS

| | | |
|---|---|---|
| JP | 5-160396 A | 6/1993 |
| JP | 5-218417 | 8/1993 |

(Continued)

OTHER PUBLICATIONS

Office Action issued Jun. 25, 2013 in Japanese Patent Application No. 2008-291217 (with English language translation).

*Primary Examiner* — Meiya Li
(74) *Attorney, Agent, or Firm* — Oblon, Spivak, McClelland, Maier & Neustadt, L.L.P.

(57) ABSTRACT

A nonvolatile semiconductor memory device includes a plurality of nonvolatile memory cells formed on a semiconductor substrate, each memory cell including source and drain regions separately formed on a surface portion of the substrate, buried insulating films formed in portions of the substrate that lie under the source and drain regions and each having a dielectric constant smaller than that of the substrate, a tunnel insulating film formed on a channel region formed between the source and drain regions, a charge storage layer formed of a dielectric body on the tunnel insulating film, a block insulating film formed on the charge storage layer, and a control gate electrode formed on the block insulating film.

10 Claims, 7 Drawing Sheets

(56) References Cited

FOREIGN PATENT DOCUMENTS

| JP | 9-74189 A | 3/1997 |
| JP | 2000-12858 A | 1/2000 |
| JP | 2000-294781 A | 10/2000 |
| JP | 2004-87671 A | 3/2004 |
| JP | 2004-336052 A | 11/2004 |
| JP | 2006-73939 A | 3/2006 |
| JP | 2007-165543 A | 6/2007 |
| JP | 2007-221106 A | 8/2007 |
| JP | 2007-251163 A | 9/2007 |
| JP | 2007-329268 A | 12/2007 |
| JP | 2007-329366 | 12/2007 |
| JP | 2008-53361 A | 3/2008 |
| JP | 2008-159804 A | 7/2008 |

* cited by examiner

FIG. 1A  Column direction

FIG. 1B  Row direction

NONVOLATILE SEMICONDUCTOR MEMORY DEVICE AND MANUFACTURING METHOD THEREOF

CROSS-REFERENCE TO RELATED APPLICATIONS

This application is based upon and claims the benefit of priority from prior Japanese Patent Application No. 2008-291217, filed Nov. 13, 2008, the entire contents of which are incorporated herein by reference.

BACKGROUND OF THE INVENTION

1. Field of the Invention

This invention relates to a nonvolatile semiconductor memory configured by a plurality of nonvolatile memory cells with the transistor structure having a charge storage layer and a manufacturing method thereof.

2. Description of the Related Art

Recently, much attention has been paid to a NAND flash memory configured by a series connection a plurality of nonvolatile memory cells with the transistor structure as one nonvolatile semiconductor memory device configuration. It is required for the memory cells (cell transistors) used in the NAND flash memory to satisfy the following two conditions. One condition is to suppress the short channel effect and maintain the preferable turn-on/off characteristic of the transistor even when the gate length is made smaller. The other condition is to raise the channel potential of a non-selected cell to prevent erroneous programming at the programming time.

In order to suppress the short channel effect, it is necessary to increase the dopant impurity concentration of the silicon substrate and reduce the depletion layer width. On the other hand, a rise in channel potential required for preventing erroneous programming is realized when the impurity concentration of the substrate is low and the depletion layer width is large. Therefore, as the gate length is reduced, the contradiction between the conditions of suppression of the short channel effect and prevention of erroneous programming becomes more significant. That is, it becomes extremely difficult to miniaturize memory cells while maintaining the basic function of the memory cell.

As one solution for the above problem, formation of memory cells on a silicon-on-insulator (SOI) substrate is provided. However, since the procurement cost for the SOI substrate is high, there occurs a problem that the SOI substrate is not suitable for a flash memory in which greater importance is attached to the manufacturing cost.

The structure in which thin insulating films are formed under source/drain regions is proposed in order to suppress the short channel effect of a MOS transistor (JP-A H5-218417 [KOKAI]). However, this is the normal transistor structure and is not the transistor structure that realizes a memory cell. Further, even if the structure is applied to a memory cell, the effect of preventing erroneous programming cannot be attained. This is because the insulating films under the source/drain regions are thin and the effect of extending the depletion layer in a depth direction of the substrate cannot be attained.

Further, in a NAND cell unit, the structure in which a thin insulating film is formed under a channel region is proposed (JP-A 2007-329366 [KOKAI]). However, the structure is made to form a NAND cell unit with a partial SOI structure and the sufficiently large effect of suppression of the short channel effect and prevention of erroneous programming is not attained.

BRIEF SUMMARY OF THE INVENTION

According to one aspect of this invention, there is provided a nonvolatile semiconductor memory device including a semiconductor substrate, a plurality of nonvolatile memory cells formed on the semiconductor substrate, and an element isolation insulating film used to isolate adjacent the memory cells, wherein each memory cell includes source and drain regions separately formed on a surface portion of the substrate, buried insulating films formed in portions of the substrate that lie under the source and drain regions and each having a dielectric constant smaller than that of the substrate, a tunnel insulating film formed on a channel region formed between the source and drain regions, a charge storage layer formed of a dielectric material on the tunnel insulating film, a block insulating film formed on the charge storage layer, and a control gate electrode formed on the block insulating film.

According to another aspect of this invention, there is provided a nonvolatile semiconductor memory device including a semiconductor substrate, and a plurality of nonvolatile memory cells formed on the semiconductor substrate, wherein each memory cell includes source and drain regions separately formed on a surface portion of the substrate, buried insulating films formed in portions of the substrate that lie under the source and drain regions and each having a dielectric constant smaller than that of the substrate, a tunnel insulating film formed on a channel region formed between the source and drain regions, a floating gate electrode formed of a conductive body provided on the tunnel insulating film, an interelectrode insulating film formed on the floating gate electrode, and a control gate electrode formed on the interelectrode insulating film.

According to still another aspect of this invention, there is provided a method for manufacturing a nonvolatile semiconductor memory device having a plurality of nonvolatile memory cells formed on a semiconductor substrate, including forming a charge storage layer on the substrate with a first gate insulating film disposed therebetween, forming a control gate electrode on the charge storage layer with a second gate insulating film disposed therebetween, processing the control gate electrode, second gate insulating film, charge storage layer and first gate insulating film to form a gate pattern, digging portions of the substrate that are exposed by the processing to forming grooves, forming buried insulating films each having a dielectric constant smaller than that of the substrate in the grooves to a position that is lower than an upper end of the substrate, forming semiconductor layers connected to side surfaces of the substrate that are exposed in the grooves on the buried insulating films, and forming source and drain regions on the semiconductor layers.

DETAILED DESCRIPTION OF THE INVENTION

First, the basic principle of this invention is explained before explaining embodiments.

A nonvolatile memory cell (cell transistor) used in this invention has the substrate structure that simultaneously realizes suppression of a short channel effect and an increase in the channel potential of a non-selected cell. That is, since buried insulating films having small dielectric constants are formed directly below source/drain electrodes, the entire peripheral portion of the channel region is surrounded by regions (insulating films) having a smaller dielectric constant than the channel region (semiconductor substrate).

Generally, the short channel effect of the transistor is determined by the ratio of the extent to which charges in the depletion layer under the channel region are controlled by the gate electrode to the extent to which they are controlled by the source/drain electrodes. As the ratio of the former case is higher, the short channel effect can be more effectively suppressed. In this case, the control by the electrode indicates that a charge flux or electric field extending between the electrode and the charges in the depletion layer is relatively stronger than a charge flux or electric field extending between the other electrode and the charges in the depletion layer.

In a nonvolatile memory cell (cell transistor) in this invention, it is possible to suppress an electric field from extending from the source/drain electrode into the channel region due to the presence of regions of small dielectric constant directly below the source/drain electrodes. Therefore, the ability of the gate electrode to control the channel region can be relatively enhanced.

Further, the rise in channel potential of the non-selected cell is determined by the potential drop in the depletion layer region controlled by the gate electrode. In the nonvolatile memory cell of this invention, the ability of controlling the gate electrode is strengthened by surrounding the peripheral portion of the cell with a low-dielectric layer (insulating film). Further, since surrounding the peripheral portion with the low-dielectric layer causes the depletion layer directly under the channel to extend in a vertical direction (in a direction perpendicular to the substrate), the rise in channel potential of the non-selected cell is increased.

Next, the condition for the thicknesses of respective layers used in this invention is explained. First, the lower limit of the thickness of the source/drain region is set to the thickness of an inversion layer occurring in the surface of the semiconductor substrate. Further, the upper limit of the thickness of the source/drain region becomes approximately equal to the gate length of the memory cell from the viewpoint of suppression of the short channel effect. It is appropriate to set the thickness of the inversion layer in the surface of the silicon substrate to approximately 1.5 nm in the case of a typical electric field (5 MV/cm in terms of an electric field in the oxide film). Further, it is appropriate to set the range of the thickness of the source/drain region not smaller than 1.5 nm and not larger than 1.1 times the gate length by referring to an example in which the junction depth of the source/drain diffusion region is defined as 1.1 times the gate length in the International Technology Roadmap for Semiconductors (ITRS).

It is desirable that the thickness of the buried insulating film formed directly under the source/drain region is larger than the thickness of the source/drain region. This is the necessary condition to induce the depletion layer directly under the channel in a vertical direction (in a direction perpendicular to the substrate).

Further, impurity is generally doped into the channel region that is located in an intermediate portion of the source/drain regions to adjust the threshold voltage. The maximum depth (used as a rough estimation of the maximum expansion of the depletion layer) of the impurity distribution should be made deeper than the depth of the upper end of the buried insulating film. Thus, the depletion layer directly under the channel can be extended in a vertical direction (in a direction perpendicular to the substrate). In this case, the maximum depth of the channel dopant impurity indicates the depth at which the concentration of impurity doped into the channel region becomes equal to the original substrate impurity concentration.

When the uniform substrate impurity concentration is used without doping impurity only into the channel region, the depletion layer should be deeper than the upper end of the buried insulating film.

The depth of the device isolation film formed in the gate width direction of the memory cell should be set sufficiently larger than the depth of the depletion layer in the channel region or the maximum depth of the dopant impurity in the channel region to prevent occurrence of the interference between adjacent elements. At this time, the depth of the device isolation insulating film is defined by the thickness from the substrate surface to the lower end thereof.

Further, as to the thickness of the buried insulating film of small dielectric constant in this invention or the depth of the lower end of the buried insulating film, the upper limit thereof is determined in relation to the maximum depth of dopant impurity or the depletion layer in the channel region in the same manner as in the case of determining the depth of the device isolation insulating film. As a result, the upper limit of the thickness of the buried insulating film of this invention or the depth of the lower end thereof should be equivalent to the depth of the device isolation insulating film and it is not necessary to set the upper limit larger than the above value.

Next, the embodiments of this invention are explained in detail with reference to the accompanying drawings.

First Embodiment

Figure 1A:
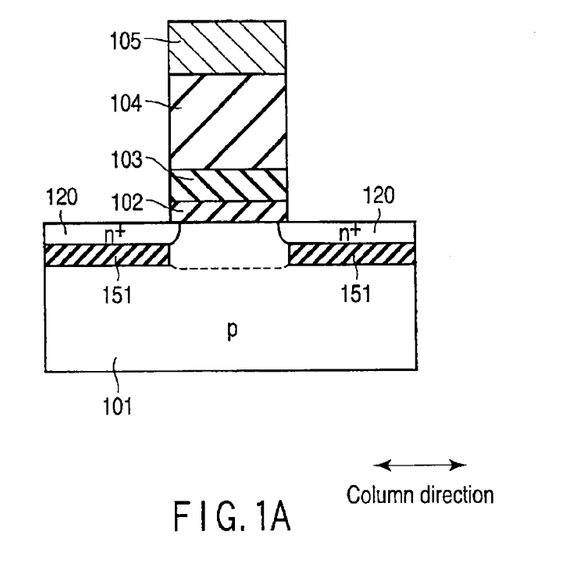
FIGS. 1A and 1B are schematic cross-sectional views of the structure of a memory cell of a nonvolatile semiconductor memory device according to a first embodiment.
Figure 1B:
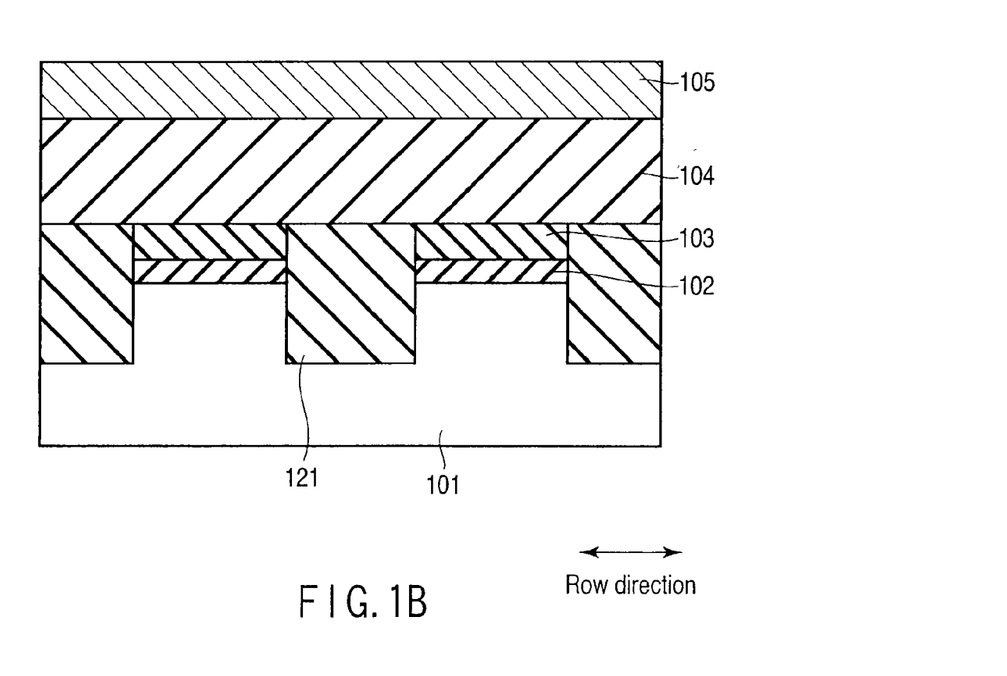

FIGS. 1A and 1B show the schematic structure of one of memory cells of a nonvolatile semiconductor memory according to a first embodiment of this invention. FIG. 1A shows a cross section taken along the channel length direction and FIG. 1B shows a cross section taken along the channel width direction. In FIGS. 1A and 1B, the channel length direction is a column direction in which bit lines extend and the channel width direction is a row direction in which word lines (control gate electrodes) extend.

On the surface portion of a p-type silicon substrate (including the case of a well) 101, $n^+$-type source/drain diffusion layers (source/drain regions) 120 are separately formed. Buried oxide films (buried insulating films) 151 used as low-dielectric layers are respectively formed directly under the source/drain regions 120.

A portion between the source diffusion layer and the drain diffusion layer is a channel region. That is, when the memory cell is set into a turn-on state, a channel is formed in the channel region that electrically connects the two source/drain regions 120.

The source/drain regions 120 are generally formed of $n^+$-type diffusion layers. However, if a plurality of such memory cells are serially connected to configure a NAND memory cell unit, $n^+$-type diffusion layers may not be necessarily formed in the source/drain regions 120. For example, inversion layers induced in the substrate surface by fringe electric fields from the gate electrodes of adjacent memory cells can be used as source/drain electrodes. In this case, the source/drain regions 120 can be kept as the p-type semiconductor regions without forming $n^+$-type diffusion layers in the source/drain regions 120.

In the example of this embodiment, the length (gate length) of the channel region lying between the source/drain regions 120 is approximately 30 nm. Further, the thickness of the source/drain region 120 is approximately 10 nm and the thickness of the buried oxide film 151 lying directly under the above region is 40 nm. When a NAND unit is formed, the length (gate length direction) of the buried oxide film 151 is set to approximately 30 nm that is equal to the gate length.

As described above, the thickness of the source/drain region 120 is set small in comparison with the gate length. Further, the thickness of the buried oxide film 151 formed directly under the source/drain region 120 is set larger than the thickness of the source/drain region 120. The depth of the depletion layer (indicated by the dotted line in FIG. 1A) corresponding to the substrate impurity concentration in this embodiment is approximately 54 nm and is set to a position near the lower end of the buried oxide film 151. Thus, a reduction in the short channel effect and expansion (rise in channel potential) of the depletion layer of a non-selected cell can be simultaneously achieved.

Next, the gate stack structure arranged on the silicon substrate 101 is explained. For example, a silicon oxynitride (SiON) film of thickness 5 nm is formed as a tunnel insulating film (first gate insulating film) 102 on the channel region. It is supposed that the mean composition of the silicon oxynitride film is $(SiO_2)_{0.8}(Si_3N_4)_{0.2}$, for example. With this composition, a rise in dielectric constant and suppression of formation of defects are simultaneously attained. Further, a silicon nitride ($Si_3N_4$) film of thickness 5 nm is formed as a charge storage layer 103 on the tunnel insulating film 102. On the silicon nitride film 103, an alumina ($Al_2O_3$) film of thickness 15 nm, for example, is formed as a block insulating film (second insulating film) 104. Further, on the block insulating film 104, for example, a control gate electrode 105 formed of a laminated layer of a tantalum nitride film (TaN) used for controlling the work function, a tungsten nitride film (WN) used as a barrier metal film and a tungsten film (W) used as a low-resistance metal film is provided.

A plurality of tunnel insulating films 102 and charge storage layers 103 are formed in the row direction and they are isolated from one another by device isolation insulating films 121 with a shallow trench isolation (STI) structure. The respective layers (104, 105) formed on the charge storage layers 103 extend in the row direction. Among the above layers, the conductive layer 105 extending in the row direction configures the word line.

In this embodiment, the block insulating film 104 also has the structure extending in the word line direction. With the above structure, the degree of leakage electric field due to the fringe electric field in the word line direction becomes smaller. Therefore, it is possible to attain a merit that an electric field from the control gate electrode 105 can be efficiently transmitted to the tunnel insulating film 102 even if the memory cell transistor is miniaturized.

It is supposed that the dopant impurity concentration (impurity concentration in the channel region) of the silicon substrate 101 is set to $4 \times 10^{17}$ cm$^{-3}$ in this embodiment. The impurity concentration can be changed in a range of approximately $1 \times 10^{17}$ to $3 \times 10^{18}$ cm$^{-3}$.

The film thickness of the tunnel insulating film 102 used in this embodiment is preferably set to approximately 2 to 8 nm. Further, in this embodiment, the silicon oxynitride film is used as the tunnel insulating film 102, but it is desirable to set the relation of $0.75 < x < 1$ in $(SiO_2)_x(Si_3N_4)_{1-x}$ as the average composition of the silicon oxynitride film from the viewpoint of reducing the in-film defects. Of course, a silicon oxide film ($SiO_2$) corresponding to the composition of limit x=1 can also be used as the tunnel insulating film. Since the potential barrier for hole is lower if the silicon oxynitride film is used as the tunnel insulating film 102, the effect of the enhanced erase operation speed of the memory cell can be attained. Likewise, as the tunnel insulating film 102, a laminated tunnel insulating film such as a laminated layer of silicon oxide film/silicon nitride film/silicon oxide film (ONO tunnel insulating film) can be used and the erase operation speed can also be enhanced in this case.

The film thickness of the silicon nitride film used as the charge storage layer 103 in this embodiment is preferably set to approximately 2 to 10 nm. The silicon nitride film is not necessarily formed of $Si_3N_4$ having stoichiometric composition. For example, the Si-rich composition may be used to increase the in-film trap density or the nitrogen-rich composition may be used to deepen the trap level. Further, the silicon nitride film used as the charge storage layer 103 can contain oxygen. The silicon nitride film is not necessarily formed of a film with uniform composition and the composition thereof may be changed in the film thickness direction.

The film thickness of the alumina film as the block insulating film 104 used in this embodiment is preferably set to approximately 5 to 20 nm. Further, the alumina film used as the block insulating film 104 may contain a slight amount of nitrogen in the film to reduce in-film defects. The block insulating film 104 is not necessarily formed of a single-layered alumina film and may be formed of a laminated block insulating film of alumina film/silicon oxide film/alumina (AOA) film, for example.

The control gate electrode 105 used in this embodiment is formed of the tantalum nitride film, but may be configured by a metal nitride or metal carbide such as TiN or TaC or a single metal material such as Mo, Pt. Further, as the control gate electrode 105, a semiconductor electrode of $n^+$-type or $p^+$-type polysilicon may be used. In addition, a silicide material such as a nickel silicide, cobalt silicide or tantalum silicide can be used to form the control gate electrode 105. When a semiconductor-type material (including a silicide) is used to form the control gate electrode, it is necessary to pay much attention to the reaction with the block insulating film 104. More specifically, an extremely thin silicon nitride film is inserted as a reaction prevention layer between the block insulating film 104 and the control gate electrode 105 configured by a semiconductor-type material.

Next, a manufacturing method of the memory cells of FIGS. 1A and 1B is explained.

In FIGS. 2A and 2B to 10A and 10B, FIGS. 2A to 10A are cross-sectional views in the channel length direction and FIGS. 2B to 10B are cross-sectional views in the channel width direction.

Figure 2A:
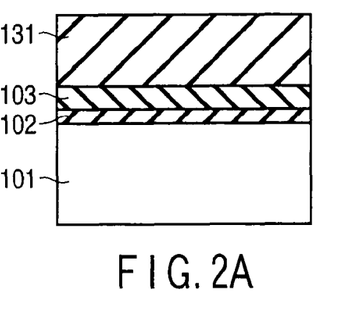
FIGS. 2A and 2B are cross-sectional views of a memory cell structure in a manufacturing step of the memory cell used in the first embodiment.
Figure 2B:
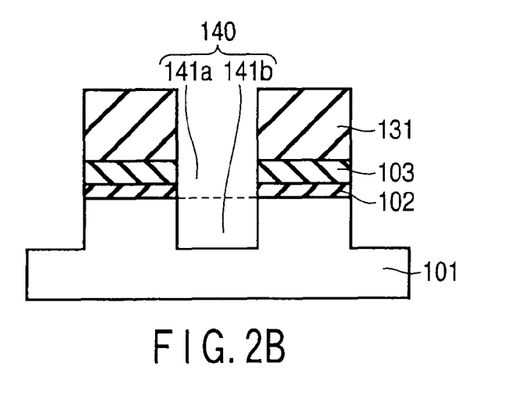

First, as shown in FIGS. 2A and 2B, after the surface of a silicon substrate (including a well) into which p-type impurity is doped is cleaned, a silicon oxide film of thickness approximately 5 nm is formed by a thermal oxidation method in the temperature range of 800 to 1000° C. Then, the silicon oxide film is nitrided by use of a plasma nitriding method to form a silicon oxynitride film as a tunnel insulating film (first gate insulating film) 102.

Subsequently, a silicon nitride film of thickness 5 nm used as a charge storage layer 103 is formed on the tunnel insulating film 102 by use of an low-pressure chemical vapor deposition (LPCVD) method using raw-material gas of dichlorosilane ($SiH_2Cl_2$) and ammonia ($NH_3$) in the temperature range of 600 to 800° C.

Next, a mask material 131 used to process device isolation regions is formed on the charge storage layer 103. A photoresist film (not shown) is formed on the mask material 131 and the process of exposing and developing the photoresist film is performed. Then, the pattern of the photoresist film is transferred onto the mask material 131 by a reactive ion etching (RIE) method. After this, the photoresist film is removed.

In this state, the charge storage layer 103 and first insulating film (tunnel insulating film) 102 are sequentially etched by the RIE method with the mask material 131 used as a mask to form slits 141a that separate the memory cells adjacent in the row direction from one another. Further, the silicon substrate 101 is etched by use of the RIE method and device isolation trenches 141b of depth approximately 100 nm are formed in the silicon substrate 101.

Figure 3A:
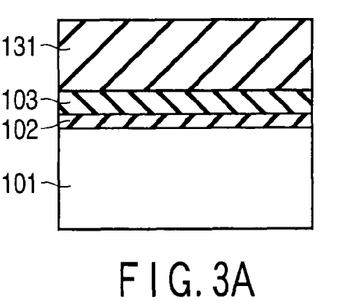
FIGS. 3A and 3B are cross-sectional views of a memory cell structure in a manufacturing step of the memory cell used in the first embodiment.
Figure 3B:
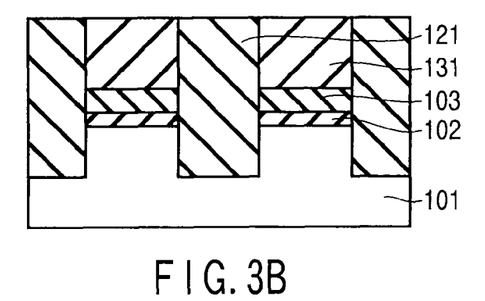

Next, as shown in FIGS. 3A and 3B, a silicon oxide film (device isolation insulating film) 121 that completely fills grooves 140 configured by the slits 141a and device isolation trenches 141b is formed by a CVD method. Then, the silicon oxide film 121 is polished until the mask material 131 is exposed by a chemical mechanical polishing (CMP) method, thereby making the surface of the silicon oxide film 121 flat.

Further, the silicon oxide film 121 is etched back by a wet-etching method. By the etching, the height of the boundary between the mask material 131 and the charge storage layer 103 is set equal to the height of the surface of the silicon oxide film 121. Then, the mask material 131 is selectively removed.

Figure 4A:
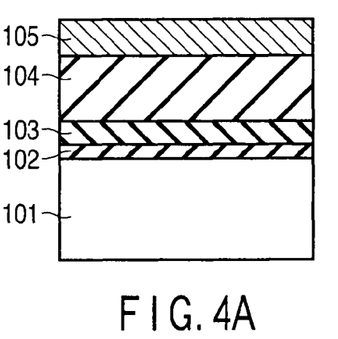
FIGS. 4A and 4B are cross-sectional views of a memory cell structure in a manufacturing step of the memory cell used in the first embodiment.
Figure 4B:
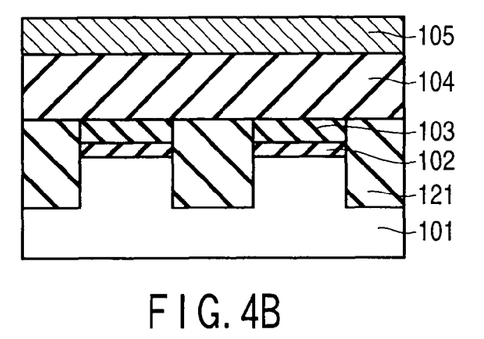

Next, as shown in FIGS. 4A and 4B, an alumina film of thickness approximately 15 nm is formed as a block insulating film 104 by use of an atomic layer deposition (ALD) method using TMA ($Al(CH_3)_3$) and $H_2O$ or $O_3$ as raw materials in the temperature range of 200 to 400° C. Then, a tantalum nitride film of thickness approximately 10 nm is deposited as a lower layer of a control gate electrode (word line) 105 on the block insulating film 104 by use of the CVD method using $Ta(N(CH_3)_2)_5$ as raw-material gas in the temperature range of 350 to 500° C., for example. Subsequently, a tungsten nitride film of thickness approximately 5 nm is deposited as a barrier metal layer of the control gate electrode 105 by use of the CVD method using $NH_3$ and $W(CO)_6$ as raw-material gas in the temperature range of 400 to 500° C., for example. Then, a tungsten film of thickness approximately 50 nm is formed as a low-resistance metal layer of the control gate electrode 105 on the above film. The tungsten film is formed by the CVD method using $W(CO)_6$ as raw-material gas in the temperature range of 400 to 500° C., for example.

Figure 5A:
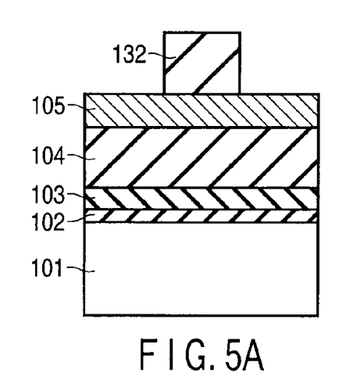
FIGS. 5A and 5B are cross-sectional views of a memory cell structure in a manufacturing step of the memory cell used in the first embodiment.
Figure 5B:
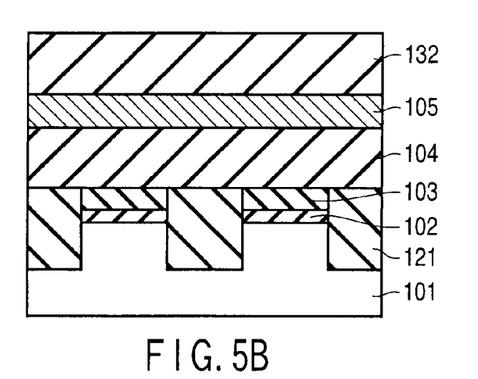

Next, as shown in FIGS. 5A and 5B, a mask material 132 is formed on the control gate electrode 105. For example, the mask material 132 is formed by depositing a silicon nitride film. A photoresist film (not shown) is formed on the mask material 132 and the process of exposing and developing the photoresist film is performed. Then, the pattern of the photoresist film is transferred onto the mask material 132 by the RIE method. After this, the photoresist film is removed.

Figure 6A:
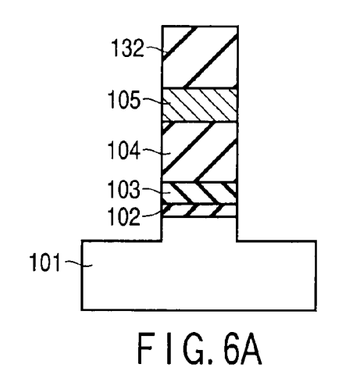
FIGS. 6A and 6B are cross-sectional views of a memory cell structure in a manufacturing step of the memory cell used in the first embodiment.
Figure 6B:
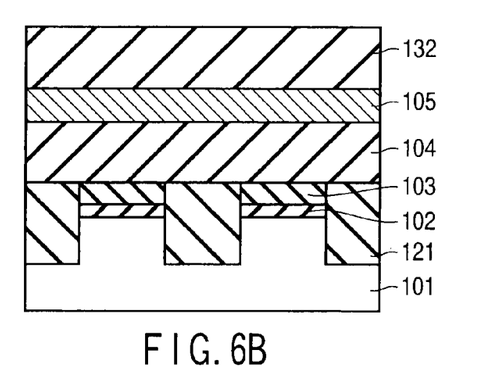

Next, as shown in FIGS. 6A and 6B, the control gate electrode 105, block insulating film 104, charge storage layer 103 and tunnel insulating film 102 are sequentially etched by the RIE method with the mask material 132 used as a mask to form MONOS gate stack structures. Then, the silicon substrate 101 is etched by approximately 50 nm by the RIE method.

Figure 7A:
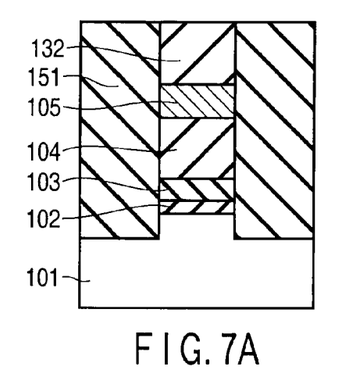
FIGS. 7A and 7B are cross-sectional views of a memory cell structure in a manufacturing step of the memory cell used in the first embodiment.
Figure 7B:
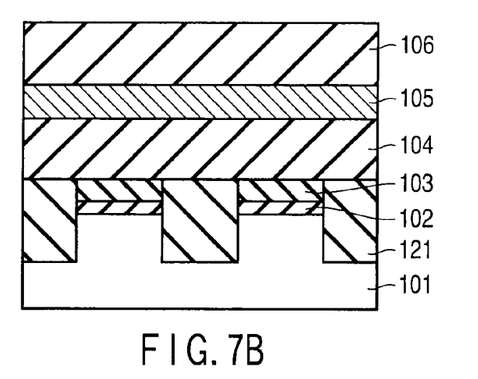

Next, as shown in FIGS. 7A and 7B, a silicon oxide film (buried oxide film) 151 that completely fills gaps between the MONOS gate stack structures is formed. Then, the silicon oxide film 151 is polished until the mask material 132 is exposed by the chemical mechanical polishing (CMP) method, thereby making the surface of the silicon oxide film 151 flat.

Figure 8A:
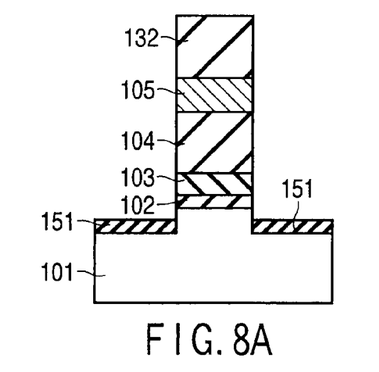
FIGS. 8A and 8B are cross-sectional views of a memory cell structure in a manufacturing step of the memory cell used in the first embodiment.
Figure 8B:
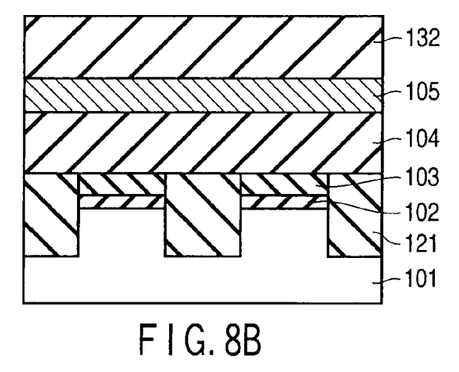

Next, the buried oxide film 151 is etched back. At this time, as shown in FIGS. 8A and 8B, the end point of etching-back is adjusted to set the height of the surface of the buried oxide film 151 lower by 10 nm than the height of the interface between the tunnel insulating film 102 and the silicon substrate 101.

Figure 9A:
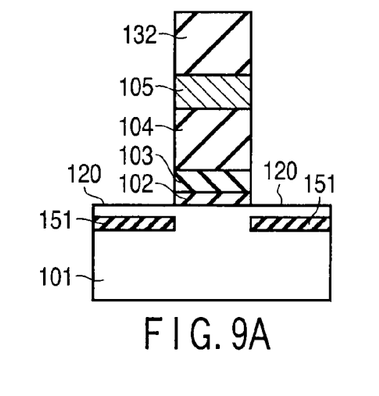
FIGS. 9A and 9B are cross-sectional views of a memory cell structure in a manufacturing step of the memory cell used in the first embodiment.
Figure 9B:
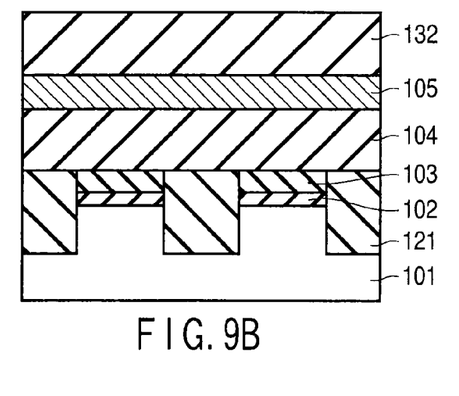

Next, as shown in FIGS. 9A and 9B, ultra-thin silicon crystal regions 120 are formed on the buried oxide films 151 by solid-phase epitaxial growth by a heating process of approximately 550 to 600° C. In order to support the solid-phase epitaxial growth, ultra-thin amorphous Si films may be previously formed on the buried oxide films 151 before the heating process. At this time, ultra-thin amorphous Si films are deposited only on the surface portions of the buried oxide films 151 by use of a method such as a sputtering method capable of depositing a film with anisotropy.

Figure 10A:
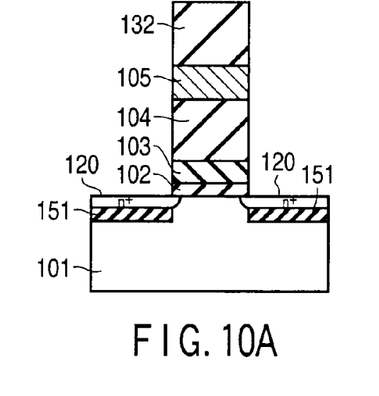
FIGS. 10A and 10B are cross-sectional views of a memory cell structure in a manufacturing step of the memory cell used in the first embodiment.
Figure 10B:
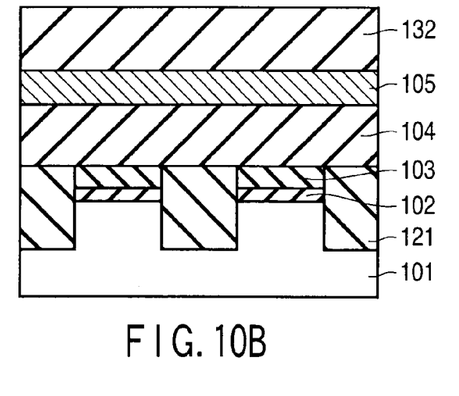

Next, a process (not shown) of forming a thin silicon oxide film on the side surfaces of the MONOS gate stack structures is performed by use of the CVD method. Then, as shown in FIGS. 10A and 10B, phosphorus (or arsenic) is doped in a self-aligned manner by an ion-implantation method and a heating process is performed to form n$^+$-type source/drain diffusion layers in the ultra-thin silicon crystal regions 120. Thus, the formation of memory cells is completed. Subsequently, the mask material 132 is removed and then an inter-layer insulating film (not shown) that covers the memory cells is formed by the CVD method.

The above manufacturing method is explained only as one example and it is possible to form the memory cells shown in FIGS. 1A and 1B by another manufacturing method.

For example, the buried oxide films 151 lying directly under the source/drain regions can be directly deposited on the surface portions of the silicon substrate 101 by use of a method such as a sputtering method capable of depositing a film with anisotropy. Further, if the gate electrode 105 is formed of a material having a heat-resistant property, buried oxide films 151 can be formed by doping oxygen ion into the surface of the silicon substrate 101 and then sufficiently performing an anneal process.

The following modification can be made as a manufacturing method of MONOS gate stack structures arranged on the upper portion of the silicon substrate 101. As the thermal oxidation method in the formation process of the tunnel insulating films 102, it is possible to use various methods such as a plasma oxidation method using $O_2$ or $H_2O$ as raw-material gas or a wet oxidation (pyrogenic oxidation) method other than the dry $O_2$ oxidation method. Further, in the process of nitriding the silicon oxide film, the nitrogen plasma process can be replaced by a heating process in an NO gas or $NH_3$ gas atmosphere.

The composition of the silicon nitride film used as the charge storage layer 103 can be changed by adjusting the flow ratio of dichlorosilane ($SiH_2Cl_2$) to ammonia ($NH_3$) used as raw-material gas in LPCVD.

Further, the alumina ($Al_2O_3$) film used as the block insulating film 104 can be formed by a metal organic chemical vapor deposition (MOCVD) method using $TMA(Al(CH_3)_3)$ and $H_2O$ as raw-material gas in the temperature range of 500 to 800° C. other than the ALD method.

The tantalum nitride film used as the lower layer of the control gate electrode 105 may be formed by the MOCVD method but can also be formed by an ALD method using $Ta(N(CH_3)_2)_5$ and $NH_3$ as raw-material gas in the temperature range of 200 to 400° C.

In addition, the raw-material gas used in the CVD (or ALD) method for formation of the respective films configuring the substrate structure and MONOS gate stack structure can be replaced by another gas. The CVD method can be replaced by a sputtering method. The respective films can be formed by using a vapor-deposition method, laser abrasion method, MBE method or a combination of the methods instead of the CVD method and sputtering method.

Figure 11:
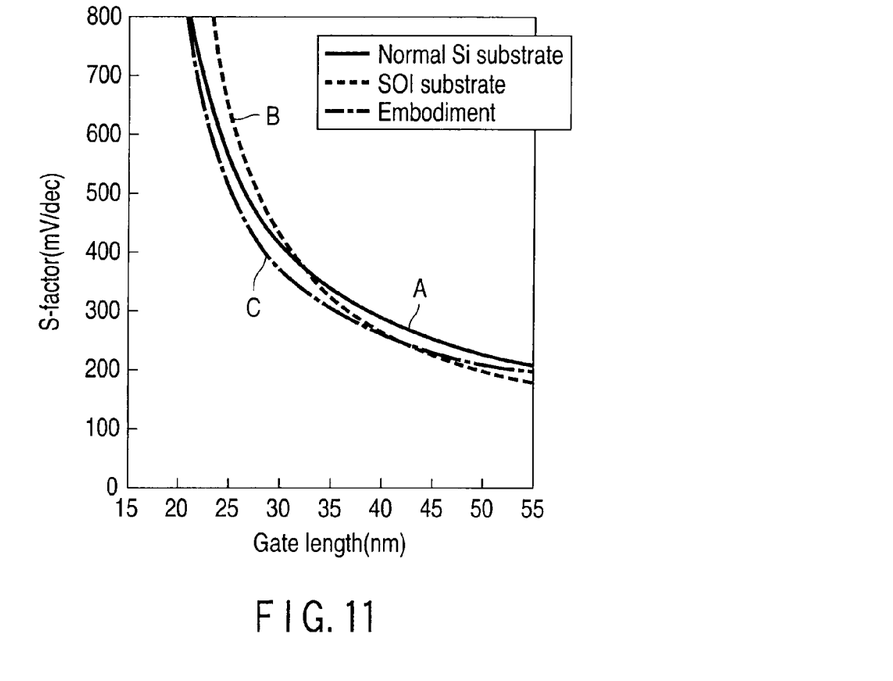
FIG. 11 is a characteristic diagram showing the dependence of the S-factor of a cell transistor on the gate length thereof in the present embodiment in comparison with the conventional case (normal silicon substrate, normal uniform SOI substrate).

Next, the result of comparison between the performance of the cell transistor of this embodiment and the performance of the cell transistor formed on the conventional substrate structure by simulation is shown. FIG. 11 shows the dependence of the S-factor of the cell transistor on the gate length in cases where MONOS memory cells are formed on A: normal silicon substrate, B: normal SOI substrate and C: substrate structure of this embodiment. In the cases of A, B and C, the silicon substrate is of p-type and the dopant impurity concentration is $4 \times 10^{17}$ cm$^{-3}$. The gate stack structure of the MONOS memory cell is configured by a laminated layer of a tunnel insulating film of 5 nm, charge storage layer of 5 nm and block insulating film of 15 nm. The S-factor of the transistor is defined as gate voltage required for increasing the drain current of the transistor by one order of magnitude and the short channel effect is more efficiently suppressed as the S-factor becomes smaller.

As is clearly understood from FIG. 11, the S-factor is suppressed to the minimum in a region (~50 nm) of large gate length in the normal SOI substrate but the S-factor is degraded in comparison with that of the normal silicon substrate in a region of the gate length that is not larger than 30 nm. On the other hand, in this embodiment, the substrate structure having the buried oxide films formed only directly under the source/drain regions exhibits a preferable S-factor in a wide range of the gate length in comparison with that of the normal silicon substrate. Further, it exhibits a preferable S-factor in a region of small gate length in comparison with that of the normal SOI substrate.

Figure 12:
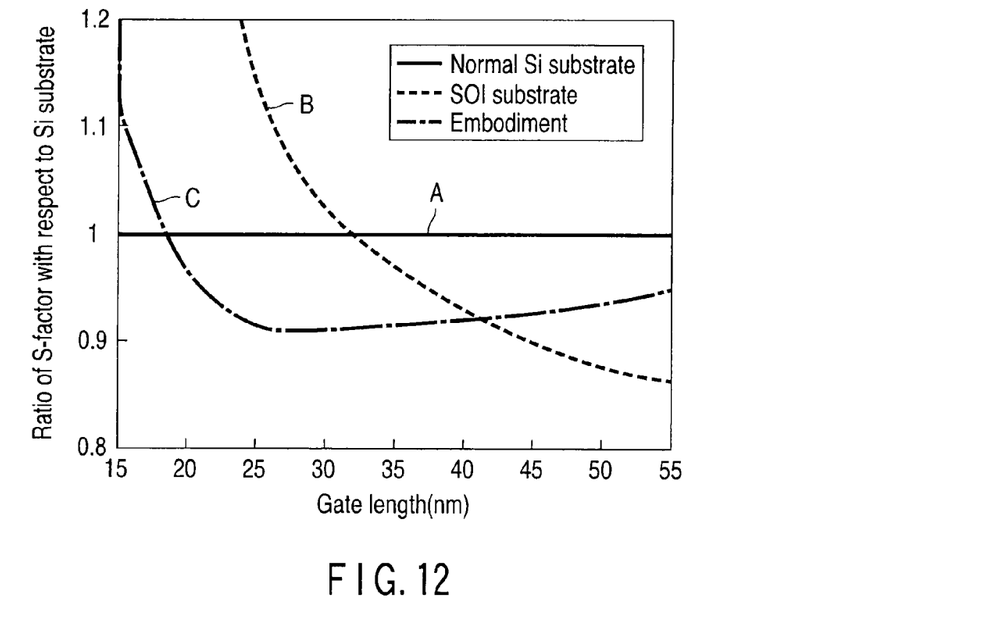
FIG. 12 is a characteristic diagram showing the dependences of S-factor ratios on the gate length in the normal silicon substrate, present embodiment and normal SOI substrate.

FIG. 12 shows the ratios of S-factors as a function of gate length with the S-factor of the normal silicon substrate as a reference. The effect of keeping the S-factor small in a region of small gate length in an example of this embodiment is clearly understood from the plots, in comparison with a case of the normal SOI substrate.

Figure 13:
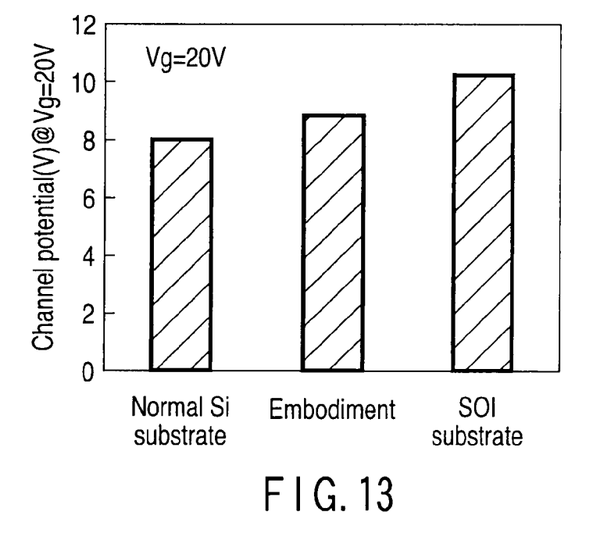
FIG. 13 is a characteristic diagram showing rises in channel potentials in cell transistors with the normal silicon substrate, present embodiment and normal SOI substrate.

FIG. 13 shows rises in channel potentials in a case where the source/drain electrodes are kept in an electrically floating state in the cell transistors (gate length: 30 nm) of the MONOS memories on the respective substrate structures. Note that the state in which the source/drain electrodes are set in the electrically floating state is an approximation to the state of the non-selected memory cell.

In this example, voltage applied to the control gate electrode is 20V. As is clearly understood from the result of FIG. 13, the example of this embodiment indicates a large rise in channel potential in comparison with that of the normal silicon substrate. The rise in channel potential is slightly smaller than that of the normal SOI substrate, but it is considered that a rise in channel potential similar to that of the normal SOI substrate can be obtained for the following two reasons.

The first reason is that the rise in channel potential is obtained as the result of estimation by calculations in a two-dimensional system by taking only the shape in the gate length direction as shown in FIG. 1A into consideration. In practice, since the device isolation insulating film is also present in the gate width direction as shown in FIG. 1B, the four peripheral surfaces of the cell transistor are surrounded by insulating films. Therefore, in practice, an even larger rise in channel potential may be estimated in comparison with the two-dimensional estimation (two peripheral surfaces are insulating films).

Further, as shown in FIGS. 11 and 12, the second reason is that the short channel effect is most efficiently suppressed in the region of small gate length in the example of this embodiment. That is, if a case wherein the degree of suppression (S-factor) of the short channel effect is kept equal is considered, the impurity concentration in the channel region in the example of this embodiment can be set lower than that of the other substrate structure. Therefore, it is considered that the effect of increasing the rise in channel potential by an amount corresponding to a reduction in impurity concentration can be obtained.

Figure 14:
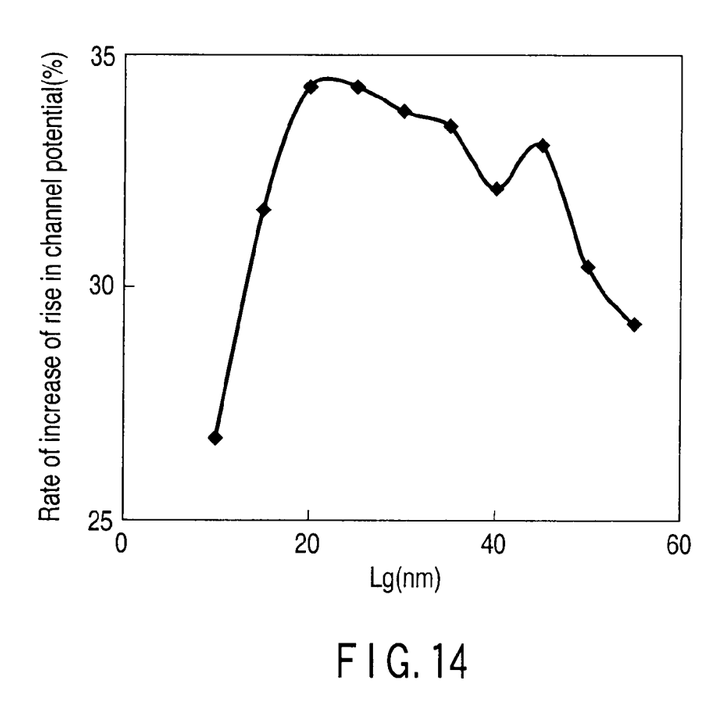
FIG. 14 is a characteristic diagram showing a rise rate of the channel potential in the first embodiment.

FIG. 14 shows the dependence of a rise in channel potential on the gate length in the example of this embodiment. The ordinate axis (rate of increase of rise in channel potential) indicates a relative value when the rise in channel potential in the case of a normal silicon substrate is set as a reference (0%) and the rise in channel potential in the case of a normal SOI substrate is set to 100%. In this case, since the calculations are made based on a two-dimensional system, much attention should be paid to the dependence on the gate length rather than the percentage value itself in FIG. 14. It is understood that the rise in channel potential in this embodiment becomes particularly effective in the region of small gate length.

By summarizing the above contents, the short channel effect can be more effectively suppressed in this embodiment in comparison with the case of the normal SOI substrate. Further, in this embodiment, the channel potential can be raised to a larger extent in comparison with the conventional silicon substrate and the effect of preventing occurrence of erroneous programming in a non-selected memory cell during the programming duration can be attained. If the substrate impurity concentration is adjusted by taking the superiority in the short channel effect into consideration, it is considered that the rise in channel potential in this embodiment becomes approximately equal to that of the normal SOI substrate.

Therefore, even when the cell transistor is miniaturized by use of this embodiment, both of a reduction in the short channel effect and prevention of occurrence of erroneous programming can be simultaneously achieved and a fine flash memory cell with excellent performance can be realized. Thus, miniaturization of a flash memory can be realized without using a normal SOI substrate whose cost is high by applying this embodiment. That is, a nonvolatile semiconductor memory device with high performance and low cost that can simultaneously attain both of suppression of the short channel effect in the memory cell and prevention of occurrence of erroneous programming can be realized.

Second Embodiment

Figure 15A:
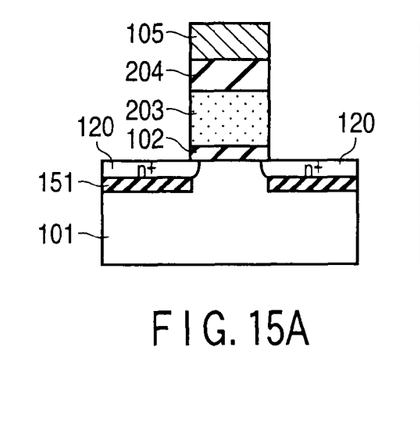
FIGS. 15A and 15B are cross-sectional views of the schematic structure of a memory cell of a nonvolatile semiconductor memory device according to a second embodiment of this invention.
Figure 15B:
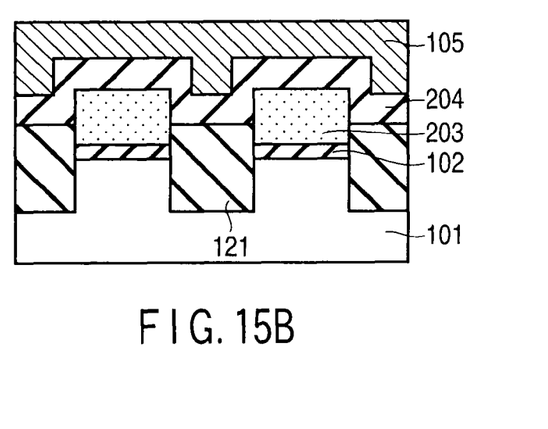

FIGS. 15A and 15B show the schematic structure of memory cells of a nonvolatile semiconductor memory device according to a second embodiment of this invention. FIG. 15A shows a cross section taken along the channel length direction and FIG. 15B shows a cross section taken along the channel width direction. Portions that are the same as those of FIGS. 1A and 1B are denoted by the same symbols and the detailed explanation thereof is omitted.

This embodiment is different from the first embodiment explained before in that a floating gate transistor is used instead of a MONOS transistor as a cell transistor. That is, as a charge storage layer, a silicon (semiconductor) film having phosphorus doped therein is used instead of the silicon nitride film.

In the following description, only a portion different from the first embodiment is explained.

The internal structure of a silicon substrate 101 is the same as that of the first embodiment. Further, the gate stack structure on the silicon substrate 101 is configured as follows. As a tunnel insulating film (first gate insulating film) 102, for example, a silicon oxynitride (SiON) film of thickness 5 nm is formed. As a charge storage layer, for example, a polysilicon film (floating gate electrode) 203 of thickness 20 nm into which phosphorus is doped at $1 \times 10^{20}$ cm$^{-3}$ is formed on the tunnel insulating film 102. For example, an alumina film of thickness 15 nm is formed as an interelectrode insulating film (second gate insulating film) 204 on the floating gate electrode 203. The structure of a control gate electrode 105 on the inter-poly insulating film 204, that is, inter-poly dielectric film is the same as that of the first embodiment.

A plurality of tunnel insulating films 102 and floating gate electrodes 203 are formed in the row direction and they are isolated from one another by device isolation insulating films 121 with the STI structure. Further, the inter-poly insulating film 204 and control gate electrode (word line) 105 are formed to extend in the row direction.

The structures of the tunnel insulating film 102 and control gate electrode 105 used in this embodiment can be modified in the same manner as in the first embodiment.

Next, modifications of the floating gate electrode 203 and inter-poly insulating film 204 used in this embodiment are explained. It is preferable that the concentration of phosphorus in silicon of the floating gate electrode 203 used in this embodiment be set in the range of $5 \times 10^{19}$ to $4 \times 10^{20}$ cm$^{-3}$ and the film thickness thereof be set in the range of approximately 5 to 50 nm. Further, it is desirable to set the film thickness of an alumina film used as the inter-poly insulating film 204 used in this embodiment to approximately 5 to 30 nm. The alumina film used as the inter-poly insulating film 204 may contain a slight amount of nitrogen in order to reduce in-film defects. The inter-poly insulating film 204 is not necessarily formed of a single-layered alumina film and may be formed of a laminated insulating film of alumina/silicon oxide/alumina (AOA) film, for example. Further, the inter-poly insulating film 204 is not necessarily formed of an alumina film and may be formed of a laminated silicon oxide/silicon nitride/silicon oxide (ONO) film or a laminated silicon nitride/silicon oxide/silicon nitride/silicon oxide/silicon nitride (NONON) film. In addition, the inter-poly insulating film may be formed of a laminated silicon nitride/silicon oxide/alumina/silicon oxide/silicon nitride (NOAON) film by combining the above films.

Next, a portion of the manufacturing method of the memory cells as shown in FIGS. 15A and 15B that is different from that of the first embodiment is explained. The process of forming the silicon oxynitride film as the tunnel insulating film 102 after the surface of a p-type silicon substrate (including the case of a well) is cleaned is the same as that of the first embodiment.

Then, a silicon film of thickness approximately 20 nm having phosphorus doped therein is formed on the tunnel insulating film 102 by an LPCVD method using dichlorosilane (SiH$_2$Cl$_2$) and phosphine (PH$_3$) as raw-material gas in the temperature range of 600 to 650° C. The silicon film functions as the floating gate electrode 203.

Subsequently, the process of forming a mask material (not shown) on the floating gate electrode 203, forming slits and device isolation trenches that isolate the memory cells adjacent in the row direction and forming a silicon oxide film (buried oxide film) 121 to completely fill the slits and trenches is the same as that of the first embodiment. Then, the silicon oxide film 121 is polished until the mask material is exposed by a CMP method and the surface of the silicon oxide film 121 is made flat.

Next, the buried oxide film 121 is etched back by a wet-etching method. The etching-back process is interrupted in the middle portion of the side surfaces of the floating gate electrode 203. Then, the mask material is selectively removed.

The succeeding process is the same as that of the first embodiment and the detailed explanation thereof is omitted.

Third Embodiment

This embodiment is an example in which NAND memory cell units are each formed by serially connecting plural memory cells formed in the first embodiment and connecting transistors functioning as selection gates to both ends of each of the respective series circuits. The individual cell transistors may be formed of either a MONOS type or floating gate type.

Figure 16:
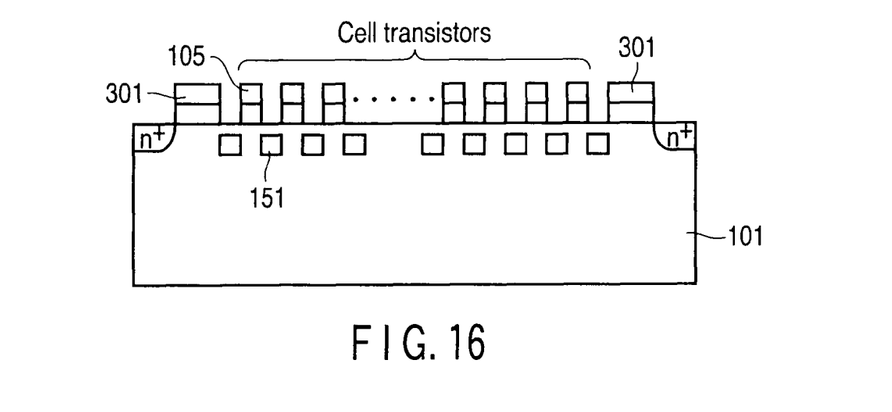
FIG. 16 is a cross-sectional view of the structure of a NAND memory cell unit according to a third embodiment of this invention.

FIG. 16 shows a cross section taken along the bit line direction of the memory cell unit of this embodiment. Portions that are the same as those of FIGS. 1A and 1B are denoted by the same symbols and the detailed explanation thereof is omitted.

In this embodiment, each of the memory cells configuring the NAND unit has no $n^+$-type source/drain diffusion layers. On the other hand, $n^+$-type source/drain diffusion layers are formed on the sides of the selection transistors with selection gates 301 which are not connected to the cell transistors.

The reason why the source/drain electrodes of the cell transistor and the selection transistor are separately formed is explained below. Since the distance between adjacent cells is short, inversion layers can be induced in the source/drain regions of the cell transistors by fringe electric fields from the gate electrodes of the adjacent cells (for example, see U.S. Patent US2008/0135912 A1). Therefore, $n^+$-type diffusion layers are not necessarily formed in the cell transistors. In addition, if the induced inversion layers are used instead of the source/drain electrodes, the short channel effect can be improved and it is suitable for miniaturization of memory cells.

On the other hand, it is necessary to form $n^+$-type diffusion layers on those sides (source line sides or bit line sides) of the selection transistors which are not connected to the cell transistors since the effect of fringe electric fields from the adjacent gate electrodes is not provided.

The manufacturing method of this embodiment is the same as that of the first or second embodiment from the viewpoint of the single cell, but much attention should be paid to formation of both of the cell transistors and selection transistors. Particularly, if the single cell is of a MONOS type, the selection transistors are formed separately from the cell transistors and formed not to have silicon nitride films that are charge storage layers. By thus forming the transistors, the threshold voltages of the selection transistors can be stabilized. Further, if the single cell is of a floating gate type, the selection transistor is formed with the structure in which the floating gate and control gate are electrically connected to each other.

(Supplementary Explanation)

The supplementary explanation for the first to third embodiments is made below.

(a) It is not always necessary to completely superimpose the buried insulating film of small dielectric constant formed directly under the source/drain region in this invention on the source/drain region when viewing from above the wafer. The position may be slightly shifted or the buried insulating film may be made larger or smaller than the source/drain region. In the embodiment described before, since the self-alignment method is used, the source/drain region almost coincides with the buried insulating film of small dielectric constant. However, when a manufacturing method of a non-self-alignment method is used, the source/drain region may be shifted from the buried insulating film in some cases. Even in such a case, since the effect of this invention can be partly attained, it is said that the above case can be set in the scope of this invention even if the slight positional deviation occurs.

(b) "Directly under" in the expression of the buried insulating film of small dielectric constant lying directly under the source/drain region in this invention includes the following contents. First, when the $n^+$-type diffusion layers are formed in the source/drain regions, it normally indicates that the $n^+$-type diffusion layers and the buried insulating films are formed in direct contact with each other. However, even when the buried insulating films and the $n^+$-type diffusion layers are not formed in direct contact with each other and the structure of $n^+$-type diffusion layer/p-type layer/buried insulating film is formed, this structure is also contained in the scope of this invention since the effect of this invention can be attained in this case. When the film thickness of the p-type layer in the structure of $n^+$-type diffusion layer/p-type layer/buried insulating film is smaller than that of the $n^+$-type diffusion layer, it is considered that the above case is contained in the scope of this invention. Since the effect of this invention becomes more significant as the p-type layer is formed thinner, it is needless to say that a larger merit can be attained by forming the p-type layer thinner.

(c) The buried insulating film of small dielectric constant formed directly under the source/drain region in this invention is frequently formed of an insulating film such as an $SiO_2$ having a dielectric constant smaller than that of the semiconductor substrate. However, it is not always necessary to form the buried insulating film by use of a silicon oxide film ($SiO_2$), since the essence of the function of the low-dielectric material is to make it difficult for the charge flux (electric field) to pass therethrough in comparison with the case of the semiconductor substrate. A silicon oxynitride film can also be used other than the silicon oxide film. Further, the buried insulating film is not necessarily formed uniformly and a porous insulating film can also be used. Further, spaces whose internal portions are filled with inert gas, nitrogen or air or vacuum can be used instead of the buried insulating films directly under the source/drain regions. Since the effect of this invention becomes more significant as the difference between the dielectric constants of the semiconductor substrate and the buried insulating films of small dielectric constant formed directly under the source/drain regions becomes larger, it is sufficiently considered to use a porous film or space while the mechanical strength is maintained. Therefore, it can be said that this case is also contained in the scope of this invention.

(d) It is indicated in the example of this embodiment that the cell transistor has the buried insulating films respectively formed directly below the source/drain electrodes. However, since the effect of this invention can be partly attained if the buried insulating film is formed directly below one of the source/drain electrodes, the structure of this case is also contained in the scope of this invention.

(e) It is indicated in this embodiment that the substrate impurity concentration is $4 \times 10^{17}$ cm$^{-3}$, but it is not limited to the above concentration and substrate impurity dopants with various concentrations, distributions and types can be used. Further, the dopant impurity concentration of the channel region located in the intermediate portion of the source/drain regions is generally used in the range of approximately $1 \times 10^{17}$ to $1 \times 10^{19}$ cm$^{-3}$.

(f) In the memory cell of this invention, the substrate impurity type can be set to either a p-type or n-type. Further, the conductivity type of the source/drain regions can be set to either a p-type or n-type. Generally, the substrate impurity and the source/drain regions are set to have different conductivity types. However, an attempt is made to further miniaturize the memory cells by setting both of them to have the same conductivity type. Also, in this case, the idea of this invention is effective.

(g) In this embodiment, an example in which the silicon oxynitride film is used as the tunnel insulating film is shown. However, a film that can be used as the tunnel insulating film is not limited to the silicon oxynitride film. For example, a tunnel insulating film with the three-layered silicon oxide/silicon nitride/silicon oxide structure can be used and a double-barrier tunnel insulating film including Si dots (Si nano-crystals) in the central portion of $SiO_2$ can be used.

(h) In this embodiment, TaN is used in a portion of the control gate electrode that is formed in contact with the second gate insulating film. However, the control gate electrode is not limited to TaN. It is possible to use polysilicon doped with n+-type or p+-type impurity, another metal material or silicide material. As an example of the above materials, a material containing at least one element selected from a group consisting of Pt, W, Ir, Ru, Re, Mo, Ti, Ta, Ni and Co, a silicide of a material containing at least one element selected from a group consisting of Pt, W, Ti, Ta, Ni and Co, a carbide of a material containing at least one element selected from a group consisting of W, Ti and Ta, a nitride of a material containing at least one element selected from a group consisting of W, Mo, Ti and Ta, a silicon nitride of a material containing Ti, or a chemical compound or mixture thereof may be provided.

(Modification)

This invention is not limited to the above embodiments.

This invention can be applied to a memory cell having a charge storage layer or floating gate. Further, this invention can be applied to a nonvolatile semiconductor memory device containing the above memory cells and particularly to a flash memory having NAND device unit configurations.

The gate stack structure of the memory cell can be formed in a well region formed near the surface of the silicon substrate. Further, an SiGe substrate, Ge substrate or SiGeC substrate may be used instead of the silicon substrate. Also, the memory cell structure can be formed in a well region formed in each of the above substrates.

The memory cell structure of the n-channel transistor on the p-type silicon substrate (including the case of a well region) is explained in this embodiment, but a memory cell structure of a p-channel transistor on an n-type silicon substrate (including the case of a well region) can be used instead of the above memory cell structure.

The idea of this invention can be applied to a memory cell with the three-dimensional structure. For example, it can be applied to a stacked flash memory (MONOS or floating gate type).

When this invention is applied to a MONOS memory cell, it can be applied to the memory cell irrespective of the operation system of MONOS. That is, for example, this invention can be applied to an operation system of a device that stores charges on the charge storage layer at the drain edge and source edge of the MONOS transistor and performs a multi-valued operation.

This invention mainly relates to an element technology of a memory cell and does not depend on the connection state in the circuit level of the memory cell. Therefore, this invention can also be applied to a NOR, AND, DINOR nonvolatile semiconductor memory, in addition to the NAND nonvolatile semiconductor memory. Further, this invention can be applied to a two-transistor flash memory having good aspects of NOR type and NAND type or a three-transistor NAND type having a structure in which one memory cell is sandwiched between two selection transistors. In addition, this invention can be applied to a flash memory having an architecture that has both of the NAND interface and the high reliability and high-speed reading function of a NOR type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate of a first conductivity type,
   a plurality of nonvolatile memory cells formed on the semiconductor substrate, and
   an device isolation insulating film used to isolate adjacent one of the memory cells,
   wherein each memory cell includes a transistor, the transistor comprising:
      a source region and a drain region separately formed on a surface portion of the substrate, the source region and the drain region comprising diffusion layers of a second conductivity type, respectively, the second conductivity type is opposite to the first conductivity type of the substrate,
      buried insulating films formed in portions of the substrate, the buried insulating films respectively lying under the source region and the drain region and each having a dielectric constant smaller than that of the substrate,
      a gate structure formed on the surface of the substrate between the source region and the drain region, the gate structure including:
         a tunnel insulating film formed on a channel region, the channel region being formed between the source region and the drain region,
         a charge storage layer formed of a dielectric material on the tunnel insulating film,
         a block insulating film formed on the charge storage layer, and
         a control gate electrode formed on the block insulating film,
      both side ends of the gate structure overlap with the source region and the drain region,
      each of the buried insulating films has a thickness larger than a thickness of each of the source region and the drain region and smaller than a thickness of the device isolation insulating film, and
      maximum depth of channel dopant impurity in the channel region is deeper than a position of an upper end of the buried insulating films and shallower than a position of a bottom of the device isolation insulating film.

2. The device according to claim 1, wherein the thickness of each of the source region and the drain region is not smaller than 1.5 nm and is not larger than 1.1 times channel length of the transistor.

3. The device according to claim 1, wherein depth of a depletion layer formed in the channel region is deeper than the position of the upper end of the buried insulating film and shallower than the position of the bottom of the device isolation insulating film.

4. The device according to claim 1, wherein the block insulating film is formed to extend in a channel width direction of the transistor and is continuously formed between every two of the memory cells that are adjacent in the channel width direction.

5. The device according to claim 1, further comprising selection transistors connected to both ends of the memory cells connected in series to form a NAND memory cell unit.

6. A nonvolatile semiconductor memory device comprising:
   a semiconductor substrate of a first conductivity type,
   a NAND memory cell unit formed on the semiconductor substrate and including a plurality of nonvolatile memory cells connected in series, and a device isolation insulating film used to isolate the NAND memory cell unit from an adjacent NAND memory cell unit, wherein each of the nonvolatile memory cells includes a transistor, the transistor comprising:

a source region and a drain region separately formed on a surface portion of the substrate, the source region and the drain region comprising diffusion layers of a second conductivity type, respectively, the second conductivity type is opposite to the first conductivity type of the substrate, buried insulating films formed in portions of the substrate, the buried insulating films respectively lying under the source region and the drain region and each having a dielectric constant smaller than that of the substrate, and a gate structure formed on the surface of the substrate between the source region and the drain region, the gate structure including:

a tunnel insulating film formed on a channel region, the channel region being formed between the source region and the drain region, a floating gate electrode formed of a conductive material provided on the tunnel insulating film, an interelectrode insulating film formed on the floating gate electrode, and a control gate electrode formed on the interelectrode insulating film, both side ends of the gate structure overlap with the source region and the drain region, each of the buried insulating films has a thickness larger than a thickness of each of the source region and the drain region and smaller than a thickness of the device isolation insulating film, and maximum depth of channel dopant impurity in the channel region is deeper than a position of an upper end of the buried insulating films and shallower than a position of a bottom of the device isolation insulating film.

7. The device according to claim 6, wherein the thickness of each of the source regions and the drain regions is not smaller than 1.5 nm and is not larger than 1.1 times channel length of the transistor which forms the memory cells.

8. The device according to claim 6, wherein depth of a depletion layer formed in the channel region is deeper than the position of the upper end of the buried insulating films and shallower than the position of the bottom of the device isolation insulating film.

9. The device according to claim 6, wherein the interelectrode insulating film is formed to extend in a channel width direction of the transistor and is continuously formed between every two of the memory cells that are adjacent in the channel width direction.

10. The device according to claim 6, the NAND memory cell unit further including selection transistors connected to both ends of the nonvolatile memory cells connected in series.

* * * * *